US008786343B2

(12) United States Patent
Geer et al.

(10) Patent No.: US 8,786,343 B2
(45) Date of Patent: Jul. 22, 2014

(54) METHOD, APPARATUS AND SYSTEM FOR SENSING A SIGNAL WITH AUTOMATIC ADJUSTMENTS FOR CHANGING SIGNAL LEVELS

(75) Inventors: Derek H. Geer, Irving, TX (US); Timothy John Smelter, Chula Vista, CA (US); John Gordon Thomas, San Diego, CA (US)

(73) Assignee: Cognitive Vision Inc., San Diego, CA (US)

( * ) Notice: Subject to any disclaimer, the term of this patent is extended or adjusted under 35 U.S.C. 154(b) by 53 days.

(21) Appl. No.: 13/510,202

(22) PCT Filed: Nov. 17, 2010

(86) PCT No.: PCT/US2010/057022
§ 371 (c)(1),
(2), (4) Date: Nov. 21, 2012

(87) PCT Pub. No.: WO2011/062983
PCT Pub. Date: May 26, 2011

(65) Prior Publication Data
US 2013/0127511 A1     May 23, 2013

Related U.S. Application Data

(60) Provisional application No. 61/262,365, filed on Nov. 18, 2009.

(51) Int. Cl.
*H03K 5/02* (2006.01)
*H03K 7/02* (2006.01)

(52) U.S. Cl.
USPC ........... 327/178; 327/164; 327/165; 324/160; 324/167; 324/179

(58) Field of Classification Search
USPC ........... 327/164, 165, 178; 324/160, 167, 179
See application file for complete search history.

(56) References Cited

U.S. PATENT DOCUMENTS

| 5,015,878 A * | 5/1991 | Lasagna et al. ................. 327/72 |
| 5,218,308 A * | 6/1993 | Bosebeck et al. ............. 324/654 |
| 2003/0058118 A1 | 3/2003 | Wilson |
| 2003/0231013 A1 | 12/2003 | Faymon et al. |
| 2008/0216567 A1 | 9/2008 | Breed |
| 2009/0146750 A1 | 6/2009 | Pernia et al. |

OTHER PUBLICATIONS

International Search Report and the Written Opinion of the International Searching Authority, International Appln. No. PCT/US2010/57022, Mailing Date: Jan. 14, 2011, 14 pages.

* cited by examiner

*Primary Examiner* — John Poos
(74) *Attorney, Agent, or Firm* — Reising Ethington P.C.

(57) ABSTRACT

The present specification provides a method, apparatus and system for sensing a signal with automatic adjustments for changing signal levels. A novel fractional peak discriminator circuit is provided which can be incorporated into a system for measuring periodic signals from moving elements. The circuit can be used regardless of whether the periodic signals are detected using optics, magnetic detector or other methods.

10 Claims, 5 Drawing Sheets

METHOD, APPARATUS AND SYSTEM FOR SENSING A SIGNAL WITH AUTOMATIC ADJUSTMENTS FOR CHANGING SIGNAL LEVELS

CROSS-REFERENCES TO RELATED APPLICATIONS

The present specification claims priority from PCT Patent Application PCT/US2010/057022, filed on Nov. 17, 2010, and U.S. Provisional Patent Application 61/262,365, filed Nov. 18, 2009, the contents of which are incorporated herein by reference.

FIELD

The present specification relates generally to signal processing and more specifically relates to a method, apparatus and system for sensing a signal with automatic adjustments for changing signal levels.

BACKGROUND

Various methods have been used to track the rotational speed of anything from car wheels to turbine engines. There are various approaches for capturing these rotational speeds. One approach is to attach a small generator, to a shaft or other rotating device which puts out a voltage proportional to the speed the generator is turning. This approach is often not desirable as it involves an additional mechanical connection.

Another approach is a magnetic tachometer having a Hall-Effect device, which changes voltage when a magnetic field passing through the tachometer changes. The voltage output is used to trigger an electronic circuit. These devices depend on the pulse being of a certain size to trigger the circuit and any attendant noise on the signal wire to be small enough not to trigger the circuit.

Another approach is optical. In this case a photo transistor or photo diode senses reflected light and when the light increases or decreases, a change in current occurs in attached circuit. This current is translated into a voltage, which is captured as noted above.

In these approaches there are three common factors: a. A rotating or oscillating machine; b. Coupling method (mechanical, magnetic, optical); c. A Circuit for detecting a voltage, voltage change, or current.

The electronics related to these approaches are tasked with ignoring electronic noise and detecting a true signal. Various methods have been used to achieve these tasks, but common methods comprise filtering noise electronically, while ensuring the signal level would be great enough or of sufficiently different frequency not to be filtered or ignored.

Of these approaches, optical systems are often selected. Optical systems include a light source and a photo sensor and a detector. The photo sensor can be, for example, a phototransistor or a photodiode or a charge coupled device (CCD). Light is emitted from the light source onto the moving part. ("Moving" captures all types of movement, including rotations and oscillations). The photo sensor captures reflections. The detector detects a difference contrast (lightness or darkness) on the moving.

In general, optical approaches face the problem of having enough light illuminating something of sufficient contrast to provide a signal big enough above the 'noise floor' to be considered valid. More specifically, problems involved in the optical approach include sufficient light; a paint spot, marked tape, color patch, (or some other optically differentiating part of the surface that add a different reflectance to the illuminating light source, and as detected by the photo sensor) which didn't fall off, fade, become tarnished, dirty, or discolored; and an electronic circuit that was tolerant of possible changes over time, optical path changes/variations, and rotating speeds. General electronics filtering and technology can be used for these purposes.

One method of handling these signals, since they do not change markedly, is to run them through a Phase-Lock-Loop. This is an electronic circuit that 'seeks' to oscillate in phase and at the same frequency as an incoming signal; but if there are some skips or small variations in the incoming signals, it will keep the output frequency steady. Thus, it is noise tolerant. This can be used since the signal does not change frequency suddenly. A car, for instance, will not come to a halt without braking, nor instantly go to sixty miles per hour without accelerating to that speed. (The only times things stop suddenly is because they hit something and the output of the tachometer is not likely to be instance under such circumstances.)

Another signal processing method is to take the AC signal (i.e., the changing part of the signal as opposed to the average or DC signal) and compare its crests to another voltage and when the crest exceeded the comparing voltage, an output pulse would be generated by the electronics to the system monitoring the speed. However this works when the signal does not change amplitude appreciably. As the moving mechanical part speeds or slows, there is a tendency for the signal to get small, since the reflected light or magnetic field is passing quicker, but this is again a slow variation with speed. However, this requires that an operator turn a knob (variable resistor) to adjust the comparison voltage to the right level to get valid output pulses.

SUMMARY

The present specification provides a signal conditioner circuit comprising: a filter for receiving an electrical signal generated by a sensor; said sensor configured to detect periodic movement and generate said electrical signal based on said periodic movement; said filter for generating a filtered signal having a peak where said electrical signal is greatest; a peak detector configured to receive said filtered signal and to detect said peak and generate a detected-peak signal that holds said peak; a peak-divider configured to receive said detected-peak signal and to divide said detected-peak signal by a predetermined amount and thereby generate a divided-peak signal; a comparator configured to receive said divided-peak signal and said filtered signal; said comparator configured to generate and output a pulse when a comparison between said divided-peak signal and said filtered signal results in a determination that said filtered signal exceeds said divided-peak signal.

The circuit can further comprise a pulse generator configured to generate a further pulse, based on said pulse; said further pulse conditioned for monitoring equipment.

The sensor can be an optical sensor.

The sensor can be a magnetic sensor.

The periodic movement can be rotational. Each peak can represent a single rotation, or a plurality of said peaks can represent a single rotation. The periodic movement may correspond to rotation of a turbine in a jet engine.

The periodic movement can be oscillatory. The periodic movement can correspond to reciprocating movement of a piston.

DETAILED DESCRIPTION OF THE EMBODIMENTS

Figure 1:
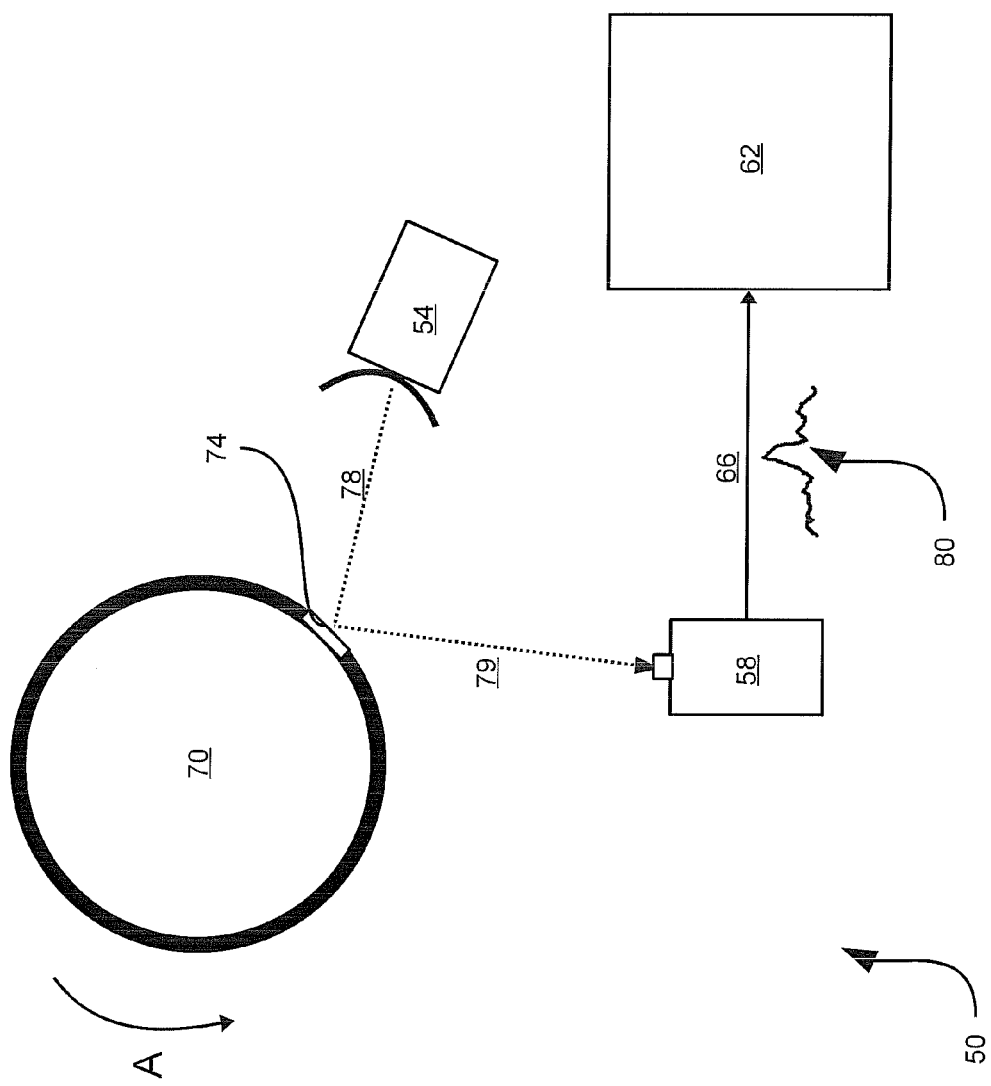
FIG. 1 shows a signal sensing system in accordance with a first embodiment.

Referring to FIG. 1, a signal sensing system is indicated generally at 50. System 50 comprises a light source 54, a light sensor 58 and a signal conditioner circuit 62 connected to the light sensor via a link 66. A moving element 70 is provided having an optical marker 74 disposed thereon. In a present example, moving element 70 is rotating in the direction "A".

Light source 54 emits light 78 which is reflected off the surface of element 70. Different amounts of light are reflected each time marker 74 passes in front of light 78. Light source can be from a fibre optic cable, or ambient light, or other source. Light sensor 58 captures reflected light 79 as it is reflected from element 70. Link 66 may be a signal wire or even a radio channel. In general link 66 is configured to introduce as little error as possible to any signal 80 captured by light sensor 58.

System 50 is a simplified illustrative example. It is to be understood however that the term "move" and its variants (e.g. "moving") can refer to any type of movement, including rotation and oscillation. A piston is an example of an oscillating element. In a practical application, moving element 70 can be, for example, an engine turbine used on an aircraft. On review of this specification, other practical applications will occur to those skilled in the art.

Notable characteristics of a periodic signal from a rotating or oscillating object, such as element 70, are that a periodic signal does change markedly in amplitude or frequency and that most noise is at most about sixty percent of the real signal amplitude. (If such characteristics are not met, the desired functionality from the rotating element will be nearly unworkable in any case.) Based on this characteristic, circuit 62 can be configured to capture the present peak signal, and then a fixed fraction of that signal can be used to validate a rotational signal. Such a circuit 62 can be configured to adapt to the time, speed, and optical/magnetic variations that can occur in tachometer systems.

Optical marker 74 is any type of contrasting mark such as a reflective tape, or paint, which changes the level of reflected light 79.

Light sensor 58 can be implemented as a phototransistor, photodiode, or charge couple device (CCD) or the like. Light sensor 58 captures reflected light 79 and generates an electrical signal 80 (e.g voltage or current) that is substantially proportional to the amount of reflected light 79 captured by light sensor 58.

Signal conditioner circuit 62 receives the electrical signal from sensor 58. Signal conditioner circuit 62, which may be referred to as a fractional peak discriminator circuit, processes the electrical signal from sensor 58 and outputs an output signal to monitoring equipment (not shown).

Figure 2:
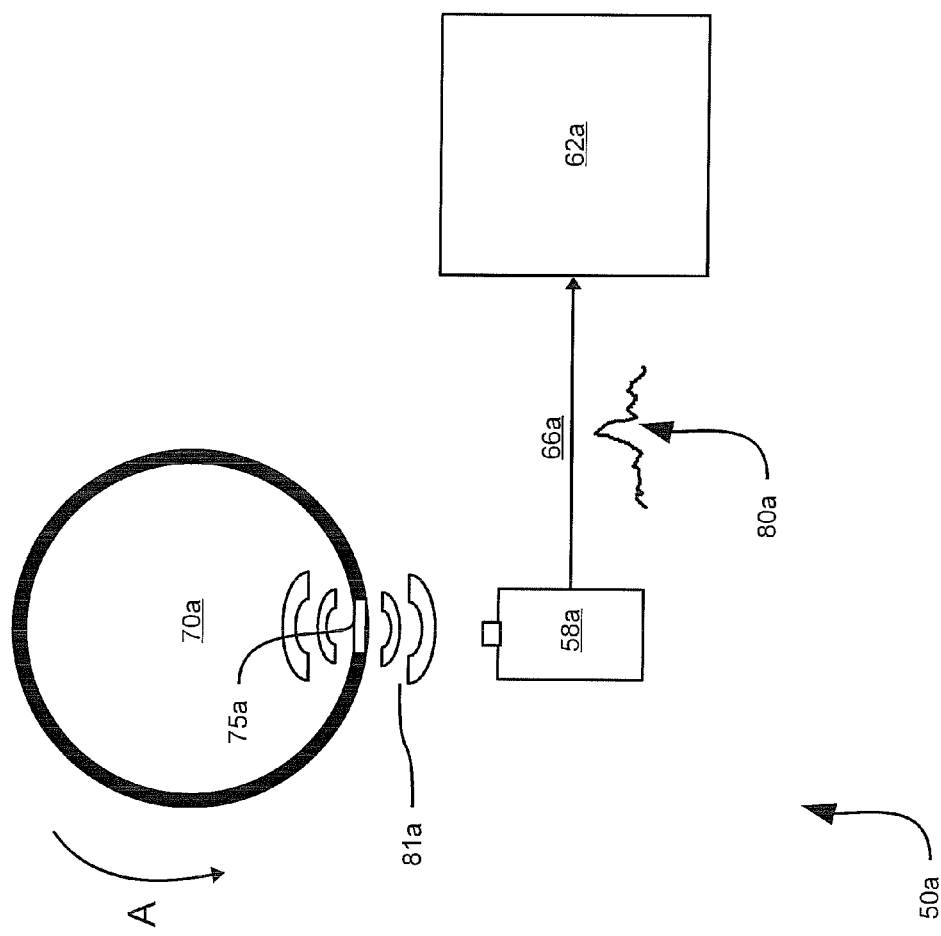
FIG. 2 shows a signal sensing system in accordance with another embodiment.

Signal conditioner circuit 62 will be discussed in greater detail below. However, before proceeding further it is to be understood that other types of sensing modalities may be used to obtain the electrical signal that is processed by signal conditioner circuit 62. Referring now to FIG. 2, another signal sensing system is indicated generally at 50a. System 50a, is a variant on system 50, and so like elements bear like references except followed by the suffix "a".

Of note is that in system 50a, light source 54 and marker 74 are eliminated. In their place, a magnetic element 75a, is provided on the surface of moving element 70a. Magnetic element 75a, emits a magnetic field 81a, which is periodically detected by a magnetic sensor 58a, used in place of optical sensor 58. Magnetic sensor 58a, is thus configured to generate an electrical signal 80a. Magnetic sensor 58a, can be based on a hall-effect detector, in which case a voltage signal is generated that is proportional to the detected magnetic field 81a. Magnetic sensor 58a, thus generates an electrical signal 80a, that is received by signal conditioner circuit 62a.

Figure 3:
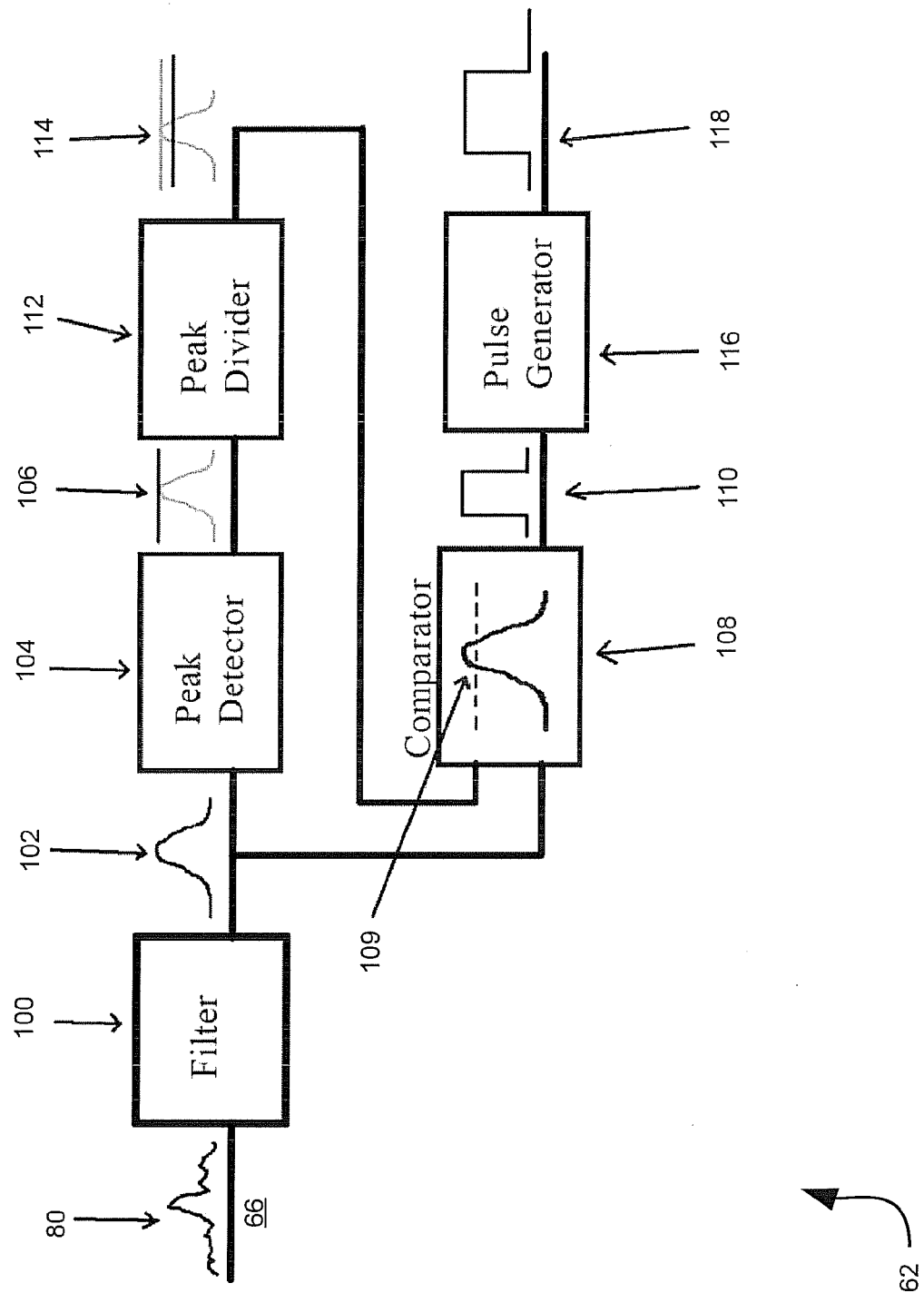
FIG. 3 shows a block diagram of an exemplary implementation of the signal conditioner circuit of FIG. 1 and FIG. 2.

FIG. 3 shows a block diagram representing a possible implementation for signal conditioner circuit 62 (or signal conditioner circuit 62a). Signal conditioner circuit 62 comprises a filter 100 which receives signal 80a, via link 66. Filter 100 input sends filtered signal 102 to a peak detector 104 and a comparator 108. The detected-peak signal 106 from peak detector 104 provides input to peak divider 112. The divided-peak signal 114 provides a second input to comparator 108, which is configured to make a comparison between filtered signal 102 and divided-peak signal 114. As will be discussed further below, comparator 108 will generate a pulse when a comparison 109 results in a determination that filtered signal 102 exceeds divided-peak signal 114. The compared-signal 110 outputted from comparator 108 provides input to pulse generator 116. Generated-pulse signals 118 are outputted from pulse generator 116 and provide input to monitoring equipment (not shown).

The operation of signal conditioner circuit 62 will now be discussed in greater detail, which will also provide further understanding as to how signal conditioner circuit 62 may be constructed. As noted above, signal 80 comes from a photosensor 58 or magnetic sensor 58a, or other type of voltage or current-generating device.

It is contemplated that system 50 may be located within a noisy environment and so noise may be introduced on link 66 or elsewhere, resulting in the acquisition of noise on link 66 (or elsewhere) which will be outside the frequency of interest for the purposes of the tachometer. Accordingly, signal 80 is filtered at filter 100 as a precautionary design practice to reduce or eliminate frequencies outside those of interest. "AC bypassing" techniques and "RC Filtering" techniques can be usual for these purposes. To add dynamic range, it can be desired to amplify the filtered version of signal 100 before doing any peak detection.

Filter 100 is thus configured to generate filtered signal 102, which is "well behaved", in that it signal 102 shows a crest or peak where the optical or magnetic return is greatest. N system 50 or system 50a, this crest or peak may be a once per revolution. However, multiple peaks may occur where a plurality of markers 74 (or magnetic elements 75a) are employed. It will now be apparent that the number of markers 74 (or magnetic elements 75a) can be selected according to the different design specifications for system 50 or system 50a.

Peak detector 104 comprises a peak-and-hold circuit, which can be implemented through the use of an operational amplifier to impress a voltage on a capacitor as the filtered signal 102 rises to a peak. A diode can also be provided to prevent (or at least reduce the likelihood of) the capacitor from discharging as the voltage declines from the peak, thus storing a voltage charge on the capacitor substantially equal to the peak of the input and filtered signal. This voltage level is transmitted to a voltage buffering circuit (also known as a voltage follower) which isolates the capacitor from discharging.

Peak divider 112 then buffers and divides the detected peak signal 106 (i.e. the peak voltage) using a voltage divider circuit, which can be implemented using two resistors in series. This can be an adjustable point on the circuit so that any percentage of the peak can be utilized as a comparison voltage to the signal peaks that follow.

Divided-peak signal 114 is the transmitted to comparator 108 to be compared with filtered signal 102. Comparator 108 is thus provided with the incoming signal train of pulses representing the optical pulses (or magnetic pulses) of element 70, and a percentage of the peak of the previous signal. Since the signal peaks are fairly constant from cycle-to-cycle, this is a substantially reliable method of detecting the next peak of the signal.

Comparator 108 thus determines when signal 102 is greater than the divided-peak signal 114. Compared-signal 110 will thus be a 'high' voltage (such as 2.4, volts to 5 volts) during the period when the incoming signal is of a greater voltage than the chosen percentage of the peak signal. Compared-signal 110 is transmitted to pulse generator 116.

Compared-signal 110 may or may not be sufficient to meet the requirements of the equipment monitoring the rotation speed of the mechanical system, therefore there a pulse generator 116 is provided which meets the voltage and amplitude needs of the monitoring equipment. It will now be apparent though that depending on the monitoring equipment, pulse generator 116 may be obviated.

Generated pulse signals 118 are then sent to the monitoring equipment, which lets the monitoring equipment know when the optical marker 74 (or magnetic element 75a) has been detected moving past on the moving element 70.

Figure 4:
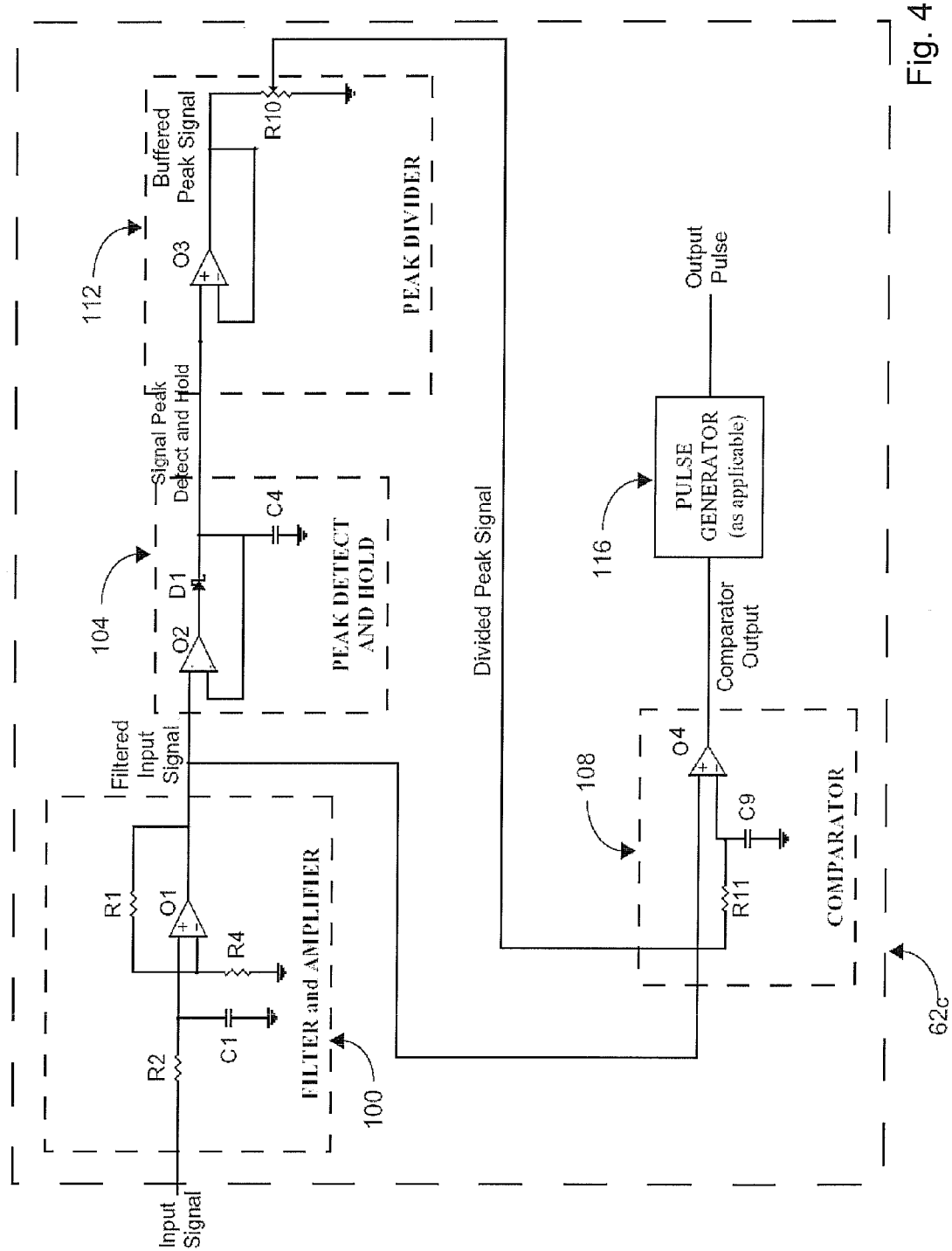
FIG. 4 shows a specific circuit diagram giving an example of how the block diagram of FIG. 3 can be implemented.

Referring now to FIG. 4 and Table I, a specific but non-limiting example of how circuit 62 can be implemented is provided, which is indicated generally as circuit 62c.

TABLE I

| Block Element | Part Reference | Part Description |
| --- | --- | --- |
| Filter 100 | R1 | Resistor, 10 kohms, 5%, 0.1 Watt U1B |
| Filter 100 | R2 | Resistor, 100 ohms, 5%, 0.1 Watt |
| Filter 100 | C1 | Capacitor 0.1 uF, 25 V, 10% |
| Filter 100 | O1 | Integrated Circuit Operational Amplifier; Prec JFET |
| Peak-detector 104 | D1 | Schottky Diode, 100 mA, VR = 45 V |
| Peak-detector 104 | C4 | Capacitor 1 uF, 16 V, 10%, C1206 |
| Peak-detector 104 | O2 | Integrated Circuit Operational Amplifier Prec JFET |
| Peak Divider 112 | R10 | Resistor, 5 Kohms |
| Peak Divider 112 | O3 | Integrated Circuit Operational Amplifier Prec JFET |
| Comparator 108 | R11 | Resistor 15 Kohms, 5%, 0.1 W |
| Comparator 108 | C9 | Capacitor 0.01 uF |
| Comparator 108 | O4 | Operational Amplifier LT3941S8 |

Figure 5:
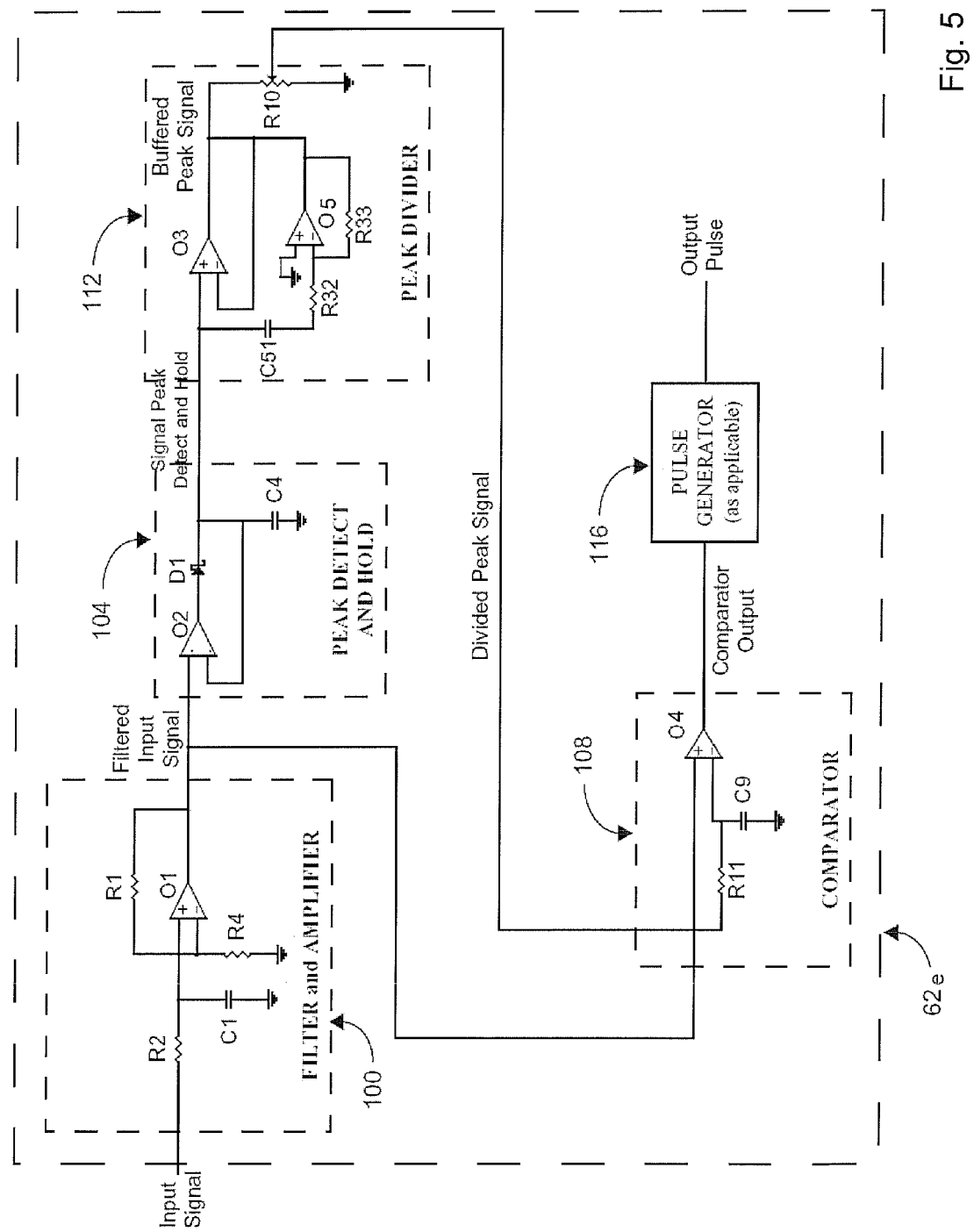
FIG. 5 shows another specific circuit diagram giving an example of how the block diagram of FIG. 3 can be implemented.

Referring now to FIG. 5 and Table II, a further specific, but non-limiting example of how circuit 62d, can be implemented is provided.

TABLE II

| Block Element | Part Reference | Part Description |
| --- | --- | --- |
| Filter 100 | R1 | Resistor, 10 kohms, 5%, 0.1 Watt U1B |
| Filter 100 | R2 | Resistor, 100 ohms, 5%, 0.1 Watt |
| Filter 100 | C1 | Capacitor 0.1 uF, 25 V, 10% |
| Filter 100 | O1 | Integrated Circuit Operational Amplifier; Prec JFET |
| Peak-detector 104 | D1 | Schottky Diode, 100 mA, VR = 45 V |
| Peak-detector 104 | C4 | Capacitor 1 uF, 16 V, 10%, C1206 |
| Peak-detector 104 | O2 | Integrated Circuit Operational Amplifier Prec JFET |
| Peak Divider 112 | R10 | Resistor, 5 Kohms |
| Peak Divider 112 | O3 | Integrated Circuit Operational Amplifier Prec JFET |
| Peak Divider 112 | C51 | Capacitor, 1.0 uF, 25 V, 5% |
| Peak Divider 112 | R32 | Resistor, 25.5 Kohms, 1%, 0.1 W |
| Peak Divider 112 | R33 | Resistor, 25.5 Kohms, 1%, 0.1 W |
| Peak Divider 112 | O5 | Integrated Circuit Operational Amplifier Prec JFET |
| Comparator 108 | R11 | Resistor 15 Kohms, 5%, 0.1 W |
| Comparator 108 | C9 | Capacitor 0.01 uF |
| Comparator 108 | O4 | Operational Amplifier LT3941S8 |

In circuit 62d, modifications were made to the peak divider 112 to reduce (and, as much as possible, minimize) jitter in the divided-peak signal 114.

This was achieved by operational amplifier O5 and the associated components as shown in FIG. 5. The added amplifiers output is summed with (connected to) the output of the voltage buffering amplifier to create a Buffered Peak Signal.

It will now be apparent that one of the advantages of provided by this specification is a means to sense of an optical or magnetic signal that automatically adjusts for a changing signal level, but not incorrectly trigger on random electronic noise.

Combinations, subsets and variations of the foregoing are contemplated.

The invention claimed is:

1. A signal conditioner circuit comprising:
a filter for receiving an electrical signal generated by a sensor; said sensor configured to detect rotational periodic movement and generate said electrical signal based on said rotational periodic movement; said filter for generating a filtered signal having a peak where said electrical signal is greatest, wherein said peak represents a single rotation;
a peak detector configured to receive said filtered signal and to detect said peak and generate a detected-peak signal that holds said peak;
a peak-divider configured to receive said detected-peak signal and to divide said detected-peak signal by a predetermined amount and thereby generate a divided-peak signal;
a comparator configured to receive said divided-peak signal and said filtered signal; said comparator configured to generate and output a pulse when a comparison between said divided-peak signal and said filtered signal results in a determination that said filtered signal exceeds said divided-peak signal.

2. The circuit of claim 1 further comprising a pulse generator configured to generate a further pulse, based on said pulse; said further pulse conditioned for monitoring equipment.

3. The circuit of claim 1 wherein said sensor is an optical sensor.

4. The circuit of claim 1 wherein said sensor is a magnetic sensor.

5. The circuit of claim 1 wherein said rotational periodic movement corresponds to rotation of a turbine in a jet engine.

6. A signal conditioner circuit comprising:
- a filter for receiving an electrical signal generated by a sensor; said sensor configured to detect rotational periodic movement and generate said electrical signal based on said rotational periodic movement; said filter for generating a filtered signal having a peak where said electrical signal is greatest, wherein a plurality of said peaks represents a single rotation;
- a peak detector configured to receive said filtered signal and to detect said peak and generate a detected-peak signal that holds said peak;
- a peak-divider configured to receive said detected-peak signal and to divide said detected-peak signal by a predetermined amount and thereby generate a divided-peak signal;
- a comparator configured to receive said divided-peak signal and said filtered signal; said comparator configured to generate and output a pulse when a comparison between said divided-peak signal and said filtered signal results in a determination that said filtered signal exceeds said divided-peak signal.

7. The circuit of claim 6 further comprising a pulse generator configured to generate a further pulse, based on said pulse; said further pulse conditioned for monitoring equipment.

8. The circuit of claim 6 wherein said sensor is an optical sensor.

9. The circuit of claim 6 wherein said sensor is a magnetic sensor.

10. The circuit of claim 6 wherein said rotational periodic movement corresponds to rotation of a turbine in a jet engine.

\* \* \* \* \*